(12) United States Patent
Dvir et al.

(10) Patent No.: US 6,781,897 B2
(45) Date of Patent: Aug. 24, 2004

(54) DEFECTS DETECTION

(75) Inventors: Ran Dvir, Beit Yehoshua (IL); Eduardo Maayan, Kfar Saba (IL); Zeev Cohen, Safed (IL)

(73) Assignee: Infineon Technologies Flash Ltd., Netanya (IL)

( * ) Notice: Subject to any disclaimer, the term of this patent is extended or adjusted under 35 U.S.C. 154(b) by 0 days.

(21) Appl. No.: 10/209,645

(22) Filed: Aug. 1, 2002

(65) Prior Publication Data

US 2004/0022092 A1 Feb. 5, 2004

(51) Int. Cl.[7] .................................................. G11C 7/00
(52) U.S. Cl. ...................................... 365/200; 365/201
(58) Field of Search ................................ 365/200, 201, 365/241, 189.01

(56) References Cited

U.S. PATENT DOCUMENTS

| | | | |
|---|---|---|---|
| 5,081,371 A | | 1/1992 | Wong |
| 5,343,431 A | * | 8/1994 | Ohtsuka et al. ............. 365/201 |
| 5,606,527 A | * | 2/1997 | Kwack et al. ............... 365/201 |
| 5,636,288 A | | 6/1997 | Bonneville et al. |
| 5,726,946 A | | 3/1998 | Yamagata et al. |
| 5,748,545 A | * | 5/1998 | Lee et al. .................... 365/201 |
| 5,847,441 A | | 12/1998 | Cutter et al. |
| 5,903,031 A | | 5/1999 | Yamada et al. |
| 5,946,258 A | | 8/1999 | Evertt et al. |
| 5,963,412 A | | 10/1999 | En |
| 6,028,324 A | | 2/2000 | Su et al. |
| 6,046,948 A | * | 4/2000 | Zheng et al. ............... 365/203 |
| 6,064,251 A | | 5/2000 | Park |
| 6,081,456 A | | 6/2000 | Dadashev |
| 6,130,574 A | | 10/2000 | Bloch et al. |
| 6,198,342 B1 | | 3/2001 | Kawai |
| 6,208,200 B1 | | 3/2001 | Arakawa |
| 6,297,974 B1 | | 10/2001 | Ganesan et al. |
| 6,353,356 B1 | | 3/2002 | Liu |
| 6,359,501 B2 | | 3/2002 | Lin et al. |
| 6,452,438 B1 | | 9/2002 | Li |
| 2002/0145464 A1 | | 10/2002 | Shor et al. |

FOREIGN PATENT DOCUMENTS

EP 0693781 1/1996

OTHER PUBLICATIONS

Martin, *Improved Circuits for the Realization of Switched–Capacitor Filters*, IEEE Transactions on Circuits and Systems, Apr. 1980, vol. CAS–27, pp. 237–244.

Umezawa, et al., *A 5–V–Only Operation 0.6–μm Flash EEPROM with Row Decoder Scheme In Triple–Well Structure*, IEEE Journal of Solid State Circuits, vol. 27, 1992, p. 1540.

\* cited by examiner

*Primary Examiner*—Anh Phung
(74) *Attorney, Agent, or Firm*—Eitan, Pearl, Latzer & Cohen Zedek, LLP (57) ABSTRACT

A method for defect detection, comprising providing a memory cell array comprising memory cells connected to word lines and local bit lines, and global bit lines connected to the local bit lines, the global bit lines comprising at least two portions, one portion connected to a voltage source, and the other portion connected to a defect detector, the defect detector comprising logic circuit components for outputting a logic signal, and detecting a defect comprising at least one of a short circuit and an open circuit in at least one of the word lines, local bit lines and global bit lines by detecting a signal at the defect detector. Embodiments of apparatus for carrying out the methods of the invention are also disclosed.

11 Claims, 11 Drawing Sheets

| WL DRIVER | | a | b | c | d | e | f | g | h |
|---|---|---|---|---|---|---|---|---|---|
| OK | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 1 |
| SHORT ac | WL[x] | 1 | 1 | | | | | | |
| | WL[x+1] | | | 0 | 1 | | | | |
| | WL[x+2] | | | | | 1 | 1 | | |
| | WL[x+3] | | | | | | | 1 | 1 |
| SHORT bd | WL[x] | 1 | 0 | | | | | | |
| | WL[x+1] | | | 1 | 1 | | | | |
| | WL[x+2] | | | | | 1 | 1 | | |
| | WL[x+3] | | | | | | | 1 | 1 |
| SHORT ce | WL[x] | 1 | 1 | | | | | | |
| | WL[x+1] | | | 0 | 1 | | | | |
| | WL[x+2] | | | | | 1 | 1 | | |
| | WL[x+3] | | | | | | | 1 | 1 |
| SHORT df | WL[x] | 1 | 1 | | | | | | |
| | WL[x+1] | | | 1 | 1 | | | | |
| | WL[x+2] | | | | | 1 | 0 | | |
| | WL[x+3] | | | | | | | 1 | 1 |
| SHORT eg | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 0 |
| SHORT fh | WL[x] | 1 | 1 | | | | | | |
| | WL[x+1] | | | 1 | 1 | | | | |
| | WL[x+2] | | | | | 1 | 0 | | |
| | WL[x+3] | | | | | | | 1 | 1 |

FIG.7

| DRIVEN WL | | a | b | c | d | e | f | g | h |
|---|---|---|---|---|---|---|---|---|---|
| OPEN ab | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 1 |
| OPEN dc | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 1 |
| OPEN ef | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 1 |
| OPEN hg | WL[x] | 1 | 1 | | | | | | |
| | WL[x+1] | | | 1 | 1 | | | | |
| | WL[x+2] | | | | | 1 | 1 | | |
| | WL[x+3] | | | | | | | 1 | 1 |

FIG.8

| DATA | LEFT ARRAY | RIGHT ARRAY |
|---|---|---|
| 0000 | METAL OPEN OR IF (wl[0] OR wl[255]) SHORT TO DUMMY wl. | METAL OPEN OR IF (wl[0] OR wl[255]) SHORT TO DUMMY wl. |
| 0001 | METAL OPEN OR IF (wl[0] OR wl[255]) SHORT TO DUMMY wl. | SHORT OR OPEN |
| 0010 | METAL OPEN OR IF (wl[0] OR wl[255]) SHORT TO DUMMY wl. | SHORT OR OPEN |
| 0011 | METAL OPEN OR IF (wl[0] OR wl[255]) SHORT TO DUMMY wl. | OK |
| 0100 | SHORT OR OPEN | METAL OPEN OR IF (wl[0] OR wl[255]) SHORT TO DUMMY wl. |
| 0101 | SHORT OR OPEN | SHORT OR OPEN |
| 0110 | SHORT OR OPEN | SHORT OR OPEN |
| 0111 | SHORT OR OPEN | OK |
| 1000 | SHORT OR OPEN | METAL OPEN OR IF (wl[0] OR wl[255]) SHORT TO DUMMY wl. |
| 1001 | SHORT OR OPEN | SHORT OR OPEN |
| 1010 | SHORT OR OPEN | SHORT OR OPEN |
| 1011 | SHORT OR OPEN | OK |
| 1100 | OK | METAL OPEN OR IF (wl[0] OR wl[255]) SHORT TO DUMMY wl. |
| 1101 | OK | SHORT OR OPEN |
| 1110 | OK | SHORT OR OPEN |
| 1111 | OK | OK |

FIG. 9A

| RESULT LEFT | RESULT RIGHT |
|---|---|
| MARK DRIVEN WL BAD | MARK DRIVEN WL BAD |
| MARK DRIVEN WL BAD | MARK DRIVEN WL AND NEIGHBORS AS BAD |
| MARK DRIVEN WL BAD | MARK DRIVEN WL AND NEIGHBORS AS BAD |
| MARK DRIVEN WL BAD | MARK WL AS GOOD |
| MARK DRIVEN WL AND NEIGHBORS AS BAD | MARK DRIVEN WL BAD |
| MARK DRIVEN WL AND NEIGHBORS AS BAD | MARK DRIVEN WL AND NEIGHBORS AS BAD |
| MARK DRIVEN WL AND NEIGHBORS AS BAD | MARK DRIVEN WL AND NEIGHBORS AS BAD |
| MARK DRIVEN WL AND NEIGHBORS AS BAD | MARK WL AS GOOD |
| MARK DRIVEN WL AND NEIGHBORS AS BAD | MARK DRIVEN WL BAD |
| MARK DRIVEN WL AND NEIGHBORS AS BAD | MARK DRIVEN WL AND NEIGHBORS AS BAD |
| MARK DRIVEN WL AND NEIGHBORS AS BAD | MARK DRIVEN WL AND NEIGHBORS AS BAD |
| MARK DRIVEN WL AND NEIGHBORS AS BAD | MARK WL AS GOOD |
| MARK WL AS GOOD | MARK DRIVEN WL BAD |
| MARK WL AS GOOD | MARK DRIVEN WL AND NEIGHBORS AS BAD |
| MARK WL AS GOOD | MARK DRIVEN WL AND NEIGHBORS AS BAD |
| MARK WL AS GOOD | MARK WL AS GOOD |

DEFECTS DETECTION

FIELD OF THE INVENTION

The present invention relates generally to detection of defects in memory cell array devices, such as, but not limited to, non-volatile memory cell arrays.

BACKGROUND OF THE INVENTION

Figure 1:
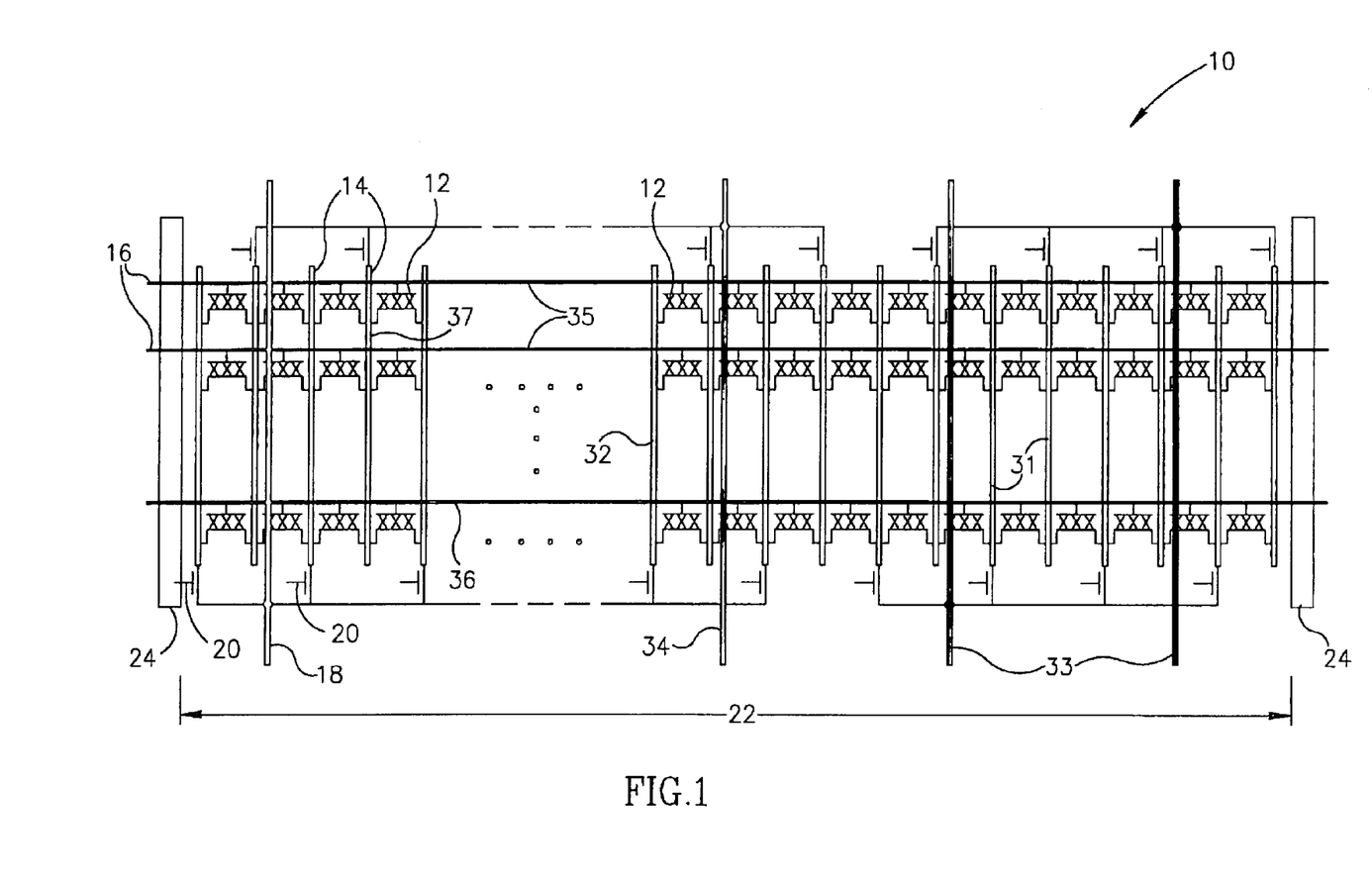
FIG. 1 is a simplified schematic illustration of a memory cell array comprising a plurality of memory cells connected to word lines and bit lines.

Memory cell arrays, such as non-volatile memory (NVM) cell array devices, may comprise a plurality of memory cells connected to word lines and bit lines. For example, FIG. 1 illustrates a typical memory cell (virtual ground) array 10. A plurality of memory cells 12, such as, but not limited to, NVM cells, e.g. nitride, read-only memory (NROM) cells, may be connected to local bit lines 14 and to word lines 16. The local bit lines 14 may be connected to global bit lines 18 via select transistors 20. The array 10 may be divided into one or more isolated slices 22 by means of isolation zones 24. The isolated slices 22 may be segmented in the bit line direction by select transistors 20, and the select transistors 20 may be arranged in distinct areas in the array 10. This segmentation creates isolated physical sectors. More than one physical sector may share the same global bit lines 18. Memory cells 12 in physical sectors that share the same global bit lines 18 may not interact due to the isolating select transistors 20.

The amount of data accessible with the array 10 may include "blocks" of data. A "block" is defined as a basic amount of data containing a certain amount of bytes. For example, a block may contain 256 bytes (256B), 512B, 528B or any other number of bytes.

In array 10, read and program operations may be performed in a block granularity, i.e., on a single block. Erase operations may be performed on a single block or groups of blocks. Such groups of blocks are defined as "erase sectors" (E-sectors). For example, an E-sector may contain 8 blocks, 32 blocks or 64 blocks or any other number of blocks.

During the manufacture of such arrays, certain defects may occur, examples of which are now explained.

As indicated by reference line 31, one local bit line 14 may become electrically shorted to another local bit line 14. Any memory cells connected to the shorted local bit lines are prone to fail due to this short. This defect may further affect the operation or performance of other memory cells within the particular isolated slice where the local bit lines short 31 occurred.

As indicated by reference line 32, a local bit line 14 may have an open circuit, e.g., due to a cut in the line or an improperly formed line, or due to improperly formed or missing contact with select transistors. Any memory cells connected to the open local bit line are prone to fail due to this open. This defect may further affect the operation or performance of other memory cells within the particular isolated slice where the local bit line open 32 occurred.

As indicated by reference line 33, one global bit line 18 may become electrically shorted to another global bit line 18. This defect may affect all the memory cells within the isolated slices of any physical sectors connected to the shorted global bit lines. If the global bit lines that are shorted to one another belong to two different isolated slices, then the operation or performance of memory cells within isolated slices that share the shorted global bit lines may be affected.

As indicated by reference line 34, a global bit line 18 may have an open circuit, e.g., due to a cut in the line or an improperly formed line, or due to improperly formed or missing contact with select transistors. This defect may affect the operation or performance of memory cells within all the isolated slices connected to the open global bit line.

As indicated by reference line 35, a word line 16 may become electrically shorted to another word line 16. This may be due to an electrical short in the formation of the material of the word line. Any memory cells connected to the shorted word lines are prone to fail due to this short. This type of defect may further affect the operation or performance of memory cells in other word lines that may be operative with the defective word lines (e.g. a word line that corresponds to the same erase sector as the defective word line).

As indicated by reference line 36, a word line 16 may have an open circuit, e.g., due to a cut in the line or an improperly formed line, or due to an improperly formed or missing electrical contact. This defect may affect the operation or performance of memory cells along the open word line, and may further affect memory cells on other word lines that may be operative with the defective word line (e.g. a word line that corresponds to the same erase sector as the defective word line).

As indicated by reference line 37, a word line 16 may become electrically shorted to a local or to a global bit line 14. This may be due to an electrical short in the formation of the materials of the word line 16 and of the local bit line 14 or the global bit line 18. This defect may affect the operation or performance of memory cells within the isolated slice where the short 37 occurred, of memory cells along the word line where the short 37 occurred, and of memory cells on other word lines that may be operative with the word line where the short 37 occurred (e.g. a word line that corresponds to the same erase sector as the defective word line).

The relative probability of the occurrence and types of defects depends on, inter alia, the manufacturing process details (e.g., etching procedures), on the line widths and spacing, on the technology design rules and on structural dimensions (e.g., intra layer dielectric thickness). Detection of structural defects as those presented above by reading, programming and erasing each of the memory cells is very time consuming. Furthermore, any trimming or tuning procedure per device that is required and which involves accessing memory cells (e.g., a reference cell programming operation relative to memory array cells), can only be performed if the structural defects have been identified and replaced upfront. Otherwise, the trimming or tuning results may be inaccurate or incorrect. Thus, an improved and time efficient method for structural defects detection is desired.

SUMMARY OF THE INVENTION

The present invention seeks to provide an improved method for detection of defects in memory cell array devices, such as, but not limited to, non-volatile memory cell arrays. The method may employ a simple defect detector added to the circuitry of the memory cell array, which may provide defect detection with logic circuitry and truth tables, as described more in detail hereinbelow.

There is thus provided in accordance with an embodiment of the present invention a method for defect detection, comprising providing a memory cell array comprising memory cells connected to word lines and local bit lines, and global bit lines connected to the local bit lines, the global bit lines comprising at least two portions, one portion connected to a voltage source, and the other portion connected to a defect detector, the defect detector comprising logic circuit components for outputting a logic signal, and detecting a defect comprising at least one of a short circuit and an open circuit in at least one of the word lines, local bit lines and global bit lines by detecting a signal at the defect detector.

In accordance with an embodiment of the present invention the detecting comprises detecting a short circuit between a pair of the global bit lines by:

a. driving a first portion of the global bit lines by the voltage source to a first voltage level, b. discharging a second portion of the global bit lines connected to the defect detector to a second voltage level, c. preventing any substantial conduction path between the two portions of global bit lines, d. disabling the discharging of the second portion of global bit lines connected to the defect detector, and e. detecting a signal at the defect detector and determining if there is a defect in accordance with the signal.

Further in accordance with an embodiment of the present invention the determining comprises determining that there is a short circuit between the global bit lines if the signal is above a predefined threshold.

Still further in accordance with an embodiment of the present invention the preventing comprises driving the word lines of memory cells operative with the at least two portions of global bit lines to a level that maintains the memory cells in a substantially non-conducting state.

In accordance with an embodiment of the present invention the preventing comprises driving the select transistors which connect the two portions of global bit lines to local bit lines to a level that maintains the select transistors in a substantially non-conducting state.

Further in accordance with an embodiment of the present invention the first and second portions of global bit lines are arranged such that in any pair of adjacent global bit lines one corresponds to the first portion and the other to the second portion.

Still further in accordance with an embodiment of the present invention the signal is relative to the voltage level of the second portion of global bit lines connected to the defect detector.

Further in accordance with an embodiment of the present invention the first voltage level is a positive voltage and the second voltage level is a close to ground voltage.

In accordance with an embodiment of the present invention the detecting comprises detecting a short circuit between a pair of the local bit lines by:

a. driving a first portion of the local bit lines by the voltage source to a first voltage level, b. driving the word lines of memory cells operative with the at least two portions of local bit lines to a level that maintains the memory cells in a substantially non-conducting state, c. discharging a second portion of the local bit lines connected to the defect detector to a second voltage level, d. disabling the discharging of the second portion of local bit lines connected to the defect detector, and e. detecting a signal at the defect detector and determining if there is a defect in accordance with the signal.

In accordance with an embodiment of the present invention the determining comprises determining that there is a short circuit between the local bit lines if the signal is above a predefined threshold.

Further in accordance with an embodiment of the present invention the signal is relative to the voltage level of the second portion of local bit lines connected to the defect detector.

Still further in accordance with an embodiment of the present invention the first and second portions of local bit lines are arranged such that in any pair of adjacent local bit lines one corresponds to the first portion and the other to the second portion.

Further in accordance with an embodiment of the present invention the first voltage level is a positive voltage and the second voltage level is a close to ground voltage.

In accordance with an embodiment of the present invention the detecting comprises detecting an open circuit in one of the local or global bit lines by:

a. driving a first portion of the local and global bit lines by the voltage source to a first voltage level, b. driving at least one word line of memory cells operative with the portions of local and global bit lines to a level that maintains the memory cells in a substantially conducting state, c. discharging a second portion of the local and global bit lines connected to the defect detector to a second voltage level, d. disabling the discharging of the second portion of local and global bit lines connected to the defect detector, and e. detecting an signal at the defect detector and determining if there is a defect in accordance with the signal.

Further in accordance with an embodiment of the present invention the determining comprises determining that there is an open circuit in one of the local or global bit lines if the signal is not above a predefined threshold.

Still further in accordance with an embodiment of the present invention the signal is relative to the voltage level of the second portion of global bit lines connected to the defect detector.

In accordance with an embodiment of the present invention the first voltage level is a positive voltage and the second voltage level is a close to ground voltage.

Further in accordance with an embodiment of the present invention each of the portions of local and global bit lines consist of a single global bit line and a single local bit line.

Still further in accordance with an embodiment of the present invention the first and second portions of local and global bit lines are arranged such that in any pair of adjacent local bit lines one corresponds to the first portion and the other to the second portion, and in any pair of adjacent global bit lines one corresponds to the first portion and the other to the second portion.

In accordance with an embodiment of the present invention the detecting comprises detecting a defect in one of the word lines by:

a. driving at least one of the word lines to a level that maintains the memory cells on that word line in a substantially conducting state, b. driving a first portion of the global and local bit lines by the voltage source to a first voltage level, discharging a second portion of the global and local bit lines connected to the defect detector to a second voltage level, c. disabling the discharging of the second portion of global bit lines connected to the defect detector, and d. detecting a signal at the defect detector and determining if there is a defect in accordance with the signal.

In accordance with an embodiment of the present invention the portions of local and global bit lines are placed close to the beginning and close to the end of the word line.

Further in accordance with an embodiment of the present invention each of the second portions of global bit lines placed close to each of the word line ends are connected to a defect detector.

Still further in accordance with an embodiment of the present invention the portions of local and global bit lines placed close to the beginning and close to the end of the word line are arranged such that in any pair of adjacent local bit lines one corresponds to the first portion and the other to the second portion, and in any pair of adjacent global bit lines one corresponds to the first portion and the other to the second portion.

In accordance with an embodiment of the present invention the determining comprises determining that there is at least one of an open circuit and a short circuit in one of the word lines if the signal of the defect detector connected to bit lines close to at least one end of one of the word lines is not above a predefined threshold.

There is also provided in accordance with an embodiment of the present invention apparatus for defect detection, comprising a memory cell array comprising memory cells connected to word lines and local bit lines, global bit lines connected to the local bit lines, the global bit lines comprising at least two portions, one portion connected to a voltage source, and the other portion connected to a defect detector, the defect detector comprising logic circuit components for outputting a logic signal.

In accordance with an embodiment of the present invention each of the portions of the global bit lines or local bit lines may be driven simultaneously or separately.

Further in accordance with an embodiment of the present invention one of the portions of the global bit lines comprises even global bit lines and the other portion of the global bit lines comprises odd global bit lines.

Still further in accordance with an embodiment of the present invention one of the portions of the local bit lines comprises even local bit lines and the other portion of the local bit lines comprises odd local bit lines.

In accordance with an embodiment of the present invention the portions of local or global bit lines are arranged such that in any pair of adjacent local bit lines one corresponds to the even portion and the other to the odd portion, and in any pair of adjacent global bit lines one corresponds to the even portion and the other to the odd portion.

Further in accordance with an embodiment of the present invention the portion of the global bit lines that is connected to the defect detector is also connected to a discharge transistor.

In accordance with an embodiment of the present invention a processor is adapted to process logic signals from the defect detector.

Further in accordance with an embodiment of the present invention the connections are electrical connections through at least one conducting transistor.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Reference is now made to FIGS. 2–10, which illustrate methods for defect detection in accordance with embodiments of the present invention.

Figure 2:
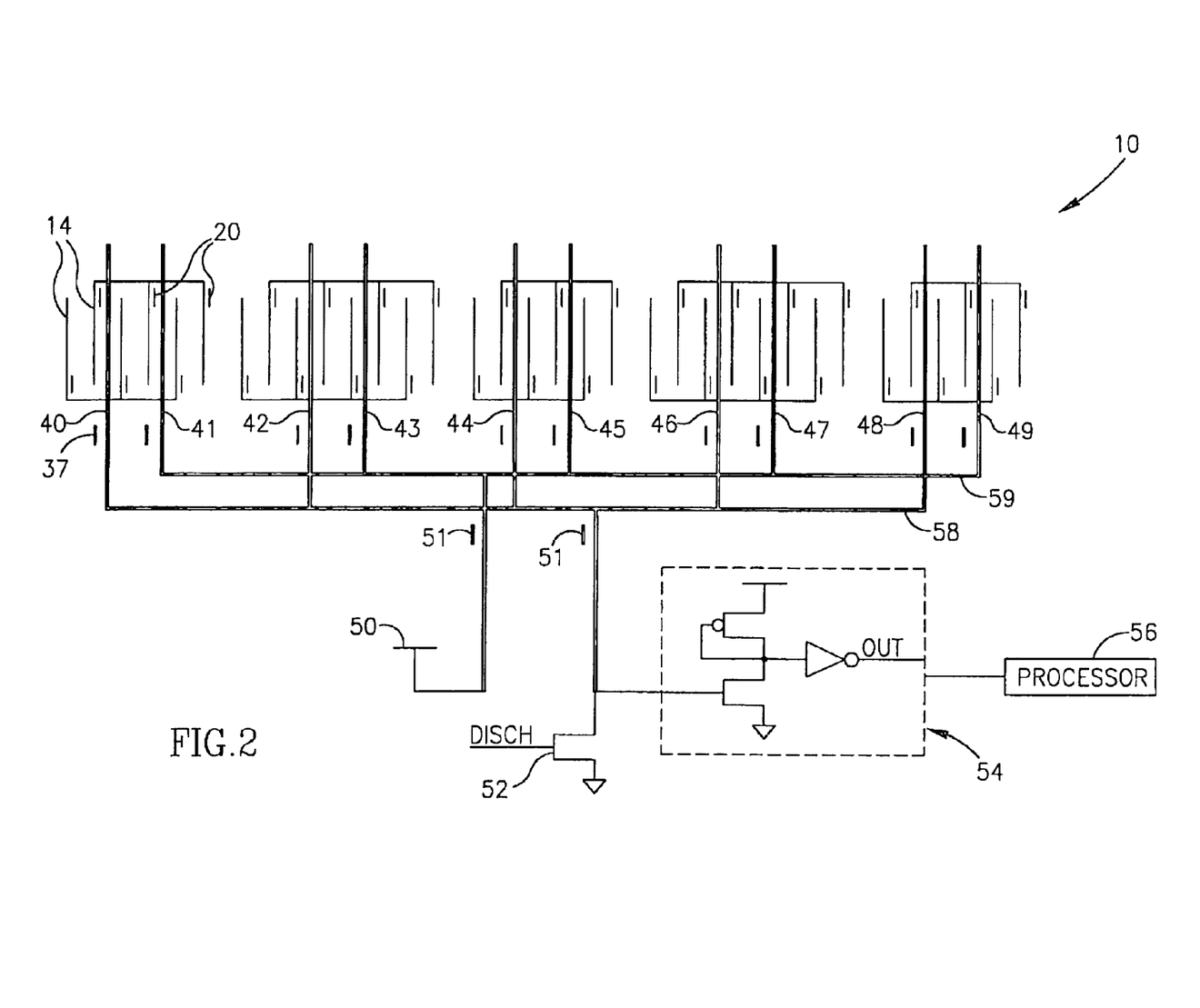
FIG. 2 is a simplified schematic illustration of a method for detecting defects due to a short in global bit lines, in accordance with an embodiment of the present invention.

FIG. 2 illustrates a method for detecting defects due to a short in global bit lines 18. For the sake of simplicity and clarity, word lines 16 and memory cells 12 are not shown in FIG. 2. The global bit lines 18 may be arranged and connected through select transistors to local bit lines 14, such that even global bit lines (e.g., global bit lines 40, 42, 44, 46 and 48) are connected to a common node 58 through column select transistors 37, and odd global bit lines (e.g., global bit lines 41, 43, 45, 47 and 49) are connected to another common node 59 through other column select transistors 37. In accordance with an embodiment of the invention, a portion of the global bit lines, for example, the odd global bit lines, may be connected to a voltage source 50, such as via one or more BS transistors 51. Another portion of the global bit lines, for example, the even global bit lines, may be connected to a discharge transistor 52, and to a defect detector 54. Defect detector 54 may comprise various logic circuit components for outputting a logic signal, which may be interpreted by a processor 56 to determine whether a defect has been detected and perhaps the nature of the defect. The logic circuit components may comprise, without limitation, two inverters as shown, but it is emphasized that the invention is not limited to the illustrated circuit.

In order to detect a short between at least two adjacent global bit lines in a given isolated slice, all select transistors 20 are preferably turned off, whereas the CS transistors 37 and the BS transistors 51 are preferably turned on. A portion of the global bit lines, for example, the odd global bit lines, may be driven to a voltage Vdd through the corresponding BS transistor 51, through node 59, and through the corresponding CS transistors 37. Another portion of the global bit lines, for example, the odd global bit lines, may be driven to a close to ground voltage through the corresponding BS transistor 51, through node 58, and through the corresponding CS transistors 37, while the discharge transistor 52 is preferably turned on. This phase is intended to initialize the input of the defect detector 54 to a close to ground voltage. Afterwards, the discharge transistor 52 may turn off. Since the select transistors 20 are non-conducting, if there is no short between any global bit lines of the two portions, then there should be little or no change at the levels of each portion of global bit lines. The first portion remains driven to the Vdd level while the second portion remains floating at a close-to-ground level. The defect detector 54 input level remains low and its output is interpreted by the processor 56 as "No defect" in the tested global bit lines, meaning there is no short in the tested global bit lines of the isolated slice 10. If, however, there is a short between the global bit lines, then the voltage level of the second portion of global bit lines (those that were left floating at a close-to-ground level) will start rising. The defect detector 54 input level will start rising as well, and as its level is higher than a certain threshold (e.g., the trip point of the input inverter in the defect detector 54), its output is interpreted by the processor 56 as "There is a defect" in the tested global bit lines, meaning there is a short in the tested global bit lines of the isolated slice 10.

Figure 3:
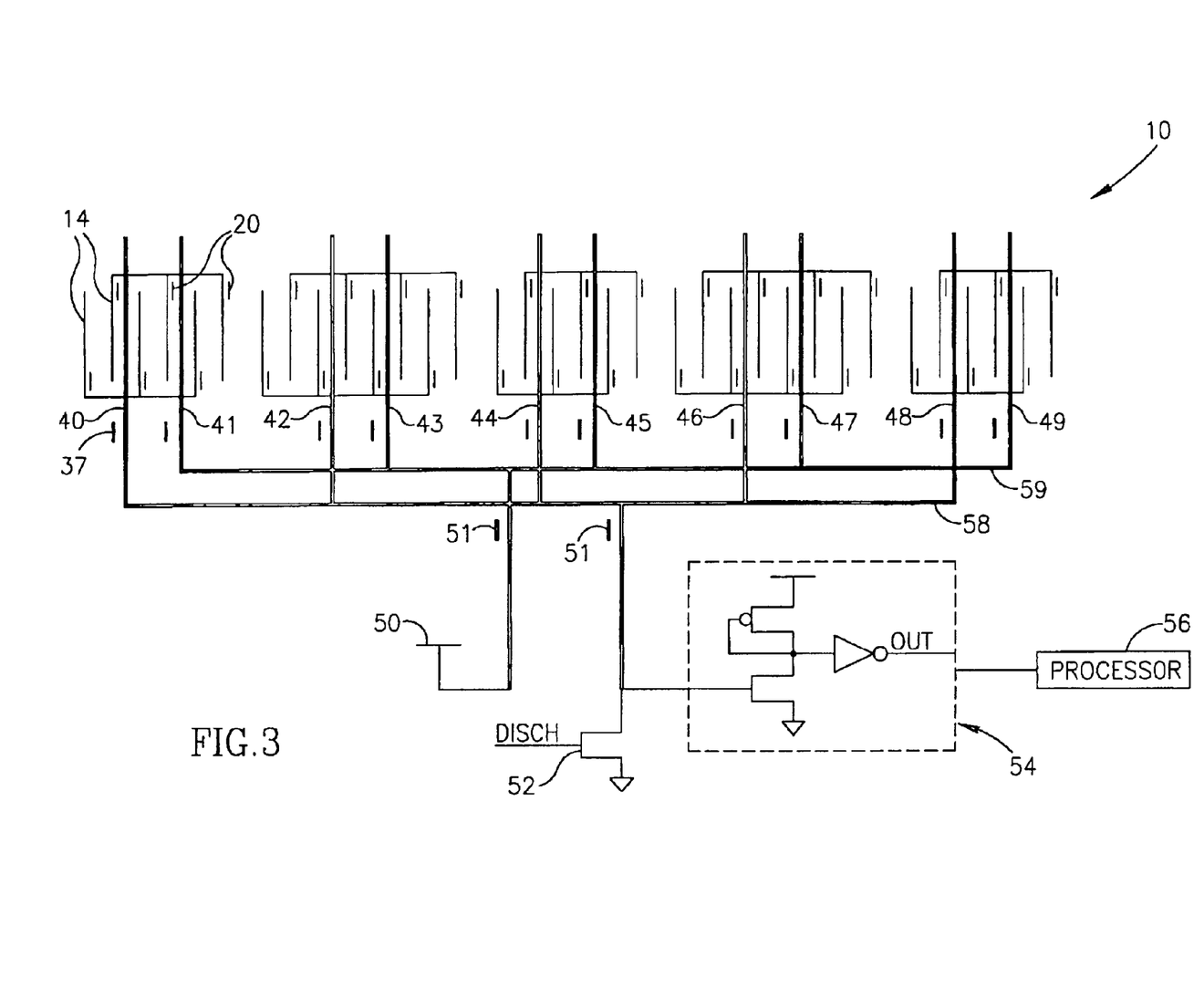
FIG. 3 is a simplified schematic illustration of a method for detecting defects due to a short in local bit lines, in accordance with an embodiment of the present invention.

Reference is now made to FIG. 3, which illustrates a method for detecting defects due to a short in local bit lines 14. Again, for the sake of simplicity and clarity, word lines 16 and memory cells 12 are not shown in FIG. 3.

In order to detect a short between local bit lines 14 in a given isolated slice, all select transistors 20, the CS transistors 37, and the BS transistors 51 are preferably turned on. The word lines 16 are preferably grounded to zero voltage to avoid a conduction path through the memory cells between adjacent local bit lines 14. A portion of the global bit lines, for example, the odd global bit lines, may be driven to a voltage Vdd through the corresponding BS transistor 51, and the corresponding CS transistors 37. Since the select transistors 20 are turned on, the corresponding odd local bit lines will also be driven to a voltage Vdd. Meanwhile, while the discharge transistor 52 is turned on, the other portion of local bit lines and global bit lines, for example the even local and global bit lines, are driven to a close to ground potential level. Afterwards, the discharge transistor 52 may be turned off, leaving the second portion of local and global bit lines, as well as the input to the defect detector 54, floating at a close-to-ground level. Since the word lines 16 are grounded, if there is no short between the local bit lines 14, and if there is also no short between the global bit lines, then there should be no conducting path between the odd and even bit lines (local and global), and the input of the defect detector 54 should remain at a close-to-ground level. This is interpreted by the processor 56 as "No defect" in the tested local and global bit lines, meaning there is no short in the tested local or global bit lines of the isolated slice 10. If, however, there is a short between local bit lines, then the voltage level of the second portion of local and global bit lines (those that were left floating at a close-to-ground level) will start rising. The defect detector 54 input level will start rising as well, and as its level is higher than a certain threshold (e.g., the trip point of the input inverter in the defect detector 54), its output is interpreted by the processor 56 as "There is a defect" in the tested local or global bit lines, meaning there is a short in the tested local or global bit lines of the isolated slice 10. It should be noted that the detection of a short between local bit lines within an isolated slice also covers the detection of a short between global bit lines of the same isolated slice. If the detection of both global bit lines shorts and local bit lines shorts is carried out, then it is possible to deduce from the results if a detected short occurred in the global or in the local bit lines. If there is no need to distinguish between the types of shorts, then a single test to detect a local bit lines short defect can cover both, saving test time.

Figure 4:
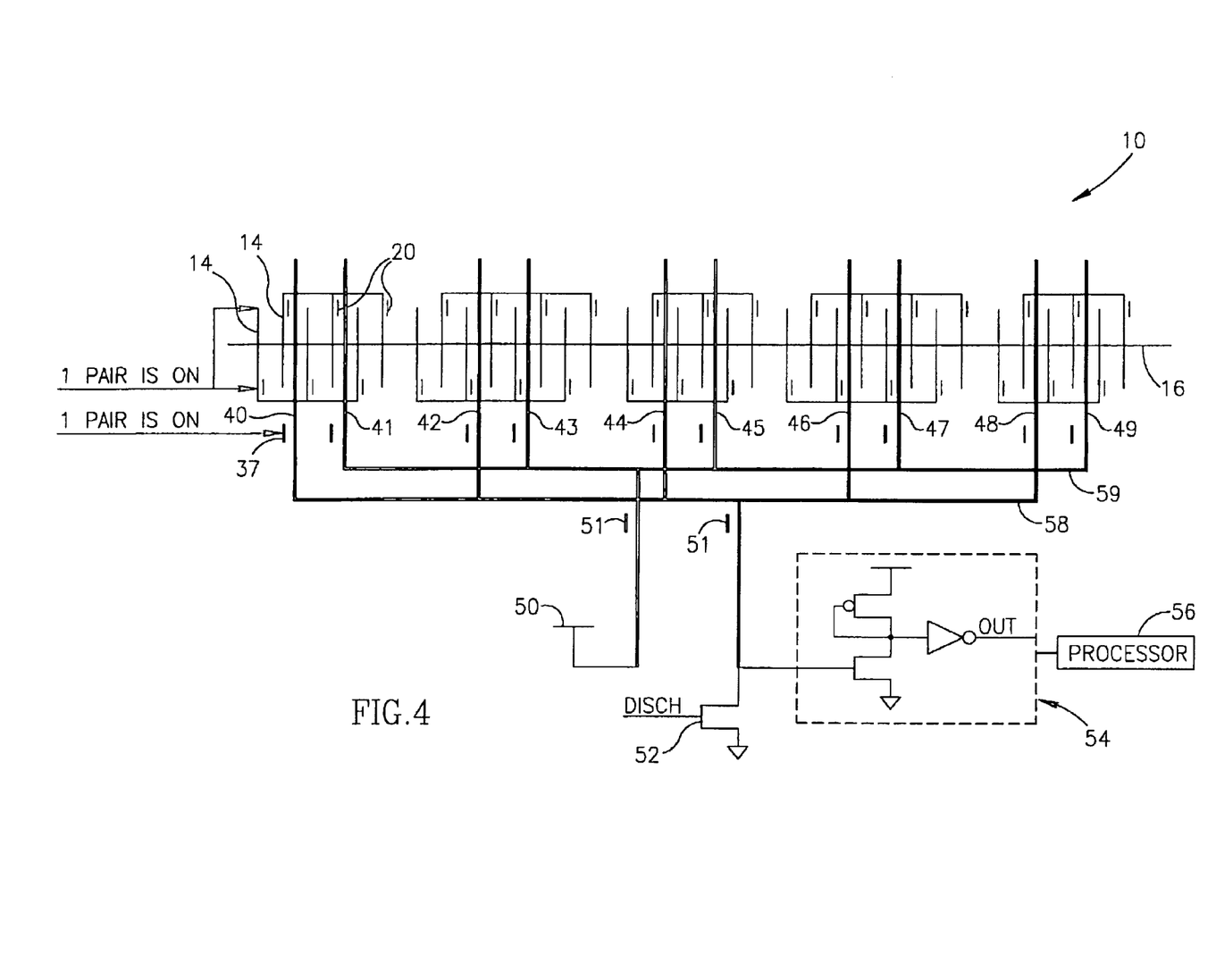
FIG. 4 is a simplified schematic illustration of a method for detecting defects due to an open circuit in either local bit lines or global bit lines, in accordance with an embodiment of the present invention.

Reference is now made to FIG. 4, which illustrates a method for detecting defects due to an open circuit in either local bit lines 14 or global bit lines 40, 41, 42, etc. Again, for the sake of simplicity and clarity, memory cells 12 are not shown in FIG. 4.

In order to detect an open circuit in either local bit lines 14 or global bit lines 18 in a given isolated slice, one of the pairs of the select transistors 20 and one of the pairs of the CS transistors 37 are preferably turned on. At least one of the word lines 16 is preferably turned on, that is, raised to a predefined voltage, preferably higher than the memory cells threshold voltage. A portion of the global bit lines, for example, the odd global bit lines, may be driven to a voltage Vdd through the corresponding BS transistors 51 and through the corresponding CS transistors 37. Meanwhile, the other portion of global bit lines, for example, the even global bit lines, may be discharged to a close-to-ground level by the discharge transistor 52, which is turned on, and through the corresponding BS transistors 51 and through the corresponding CS transistors 37. Since at least one word line 16 is driven high during this phase, current may flow from the voltage source 50, through the memory cells, to the ground through the discharge transistor 52. This phase initializes the input of the defect detector 54 to a close-to-ground level. Afterwards, the discharge transistor 52 may be turned off. In this case, since the word line 16 is turned on, if there is no open circuit in any of the accessed bit lines, local or global, the input of the defect detector 54 will start rising, and as its level is higher than a certain threshold (e.g., the trip point of the input inverter in the defect detector 54), its output is interpreted by the processor 56 as "No defect" in the tested local or global bit lines, meaning there is no open circuit in the tested local or global bit lines of the isolated slice 10. If, however, there is an open circuit in the accessed local or global bit lines, then the defect detector 54 input will remain at a close-to-ground level, below a certain threshold (e.g., the trip point of the input inverter in the defect detector 54), and its output is interpreted by the processor 56 as "There is a defect" in the tested local or global bit lines, meaning there is an open circuit in the tested local or global bit lines of the isolated slice 10.

Figure 5:
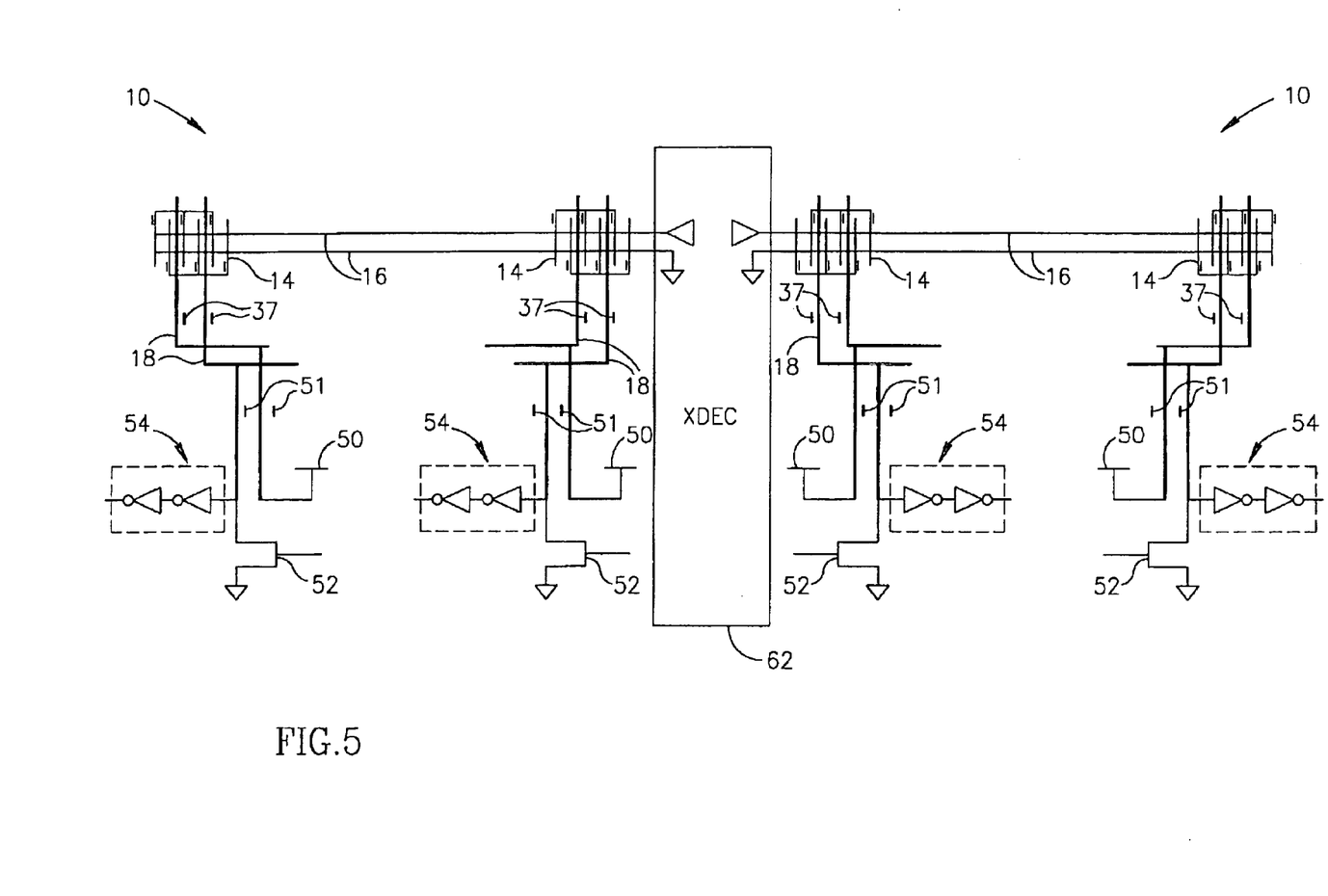
FIG. 5 is a simplified schematic illustration of a method for detecting defects (short or open circuits) in word lines, in accordance with an embodiment of the present invention.

Reference is now made to FIG. 5, which illustrates a method for detecting defects in word lines 16. For the sake of simplicity and clarity, memory cells 12 are not shown in FIG. 5. In the example illustrated in FIG. 5, there is an array 100 constructed by isolated slices 10 sharing the same word lines, driven by an X-decoder (XDEC) 62. It is emphasized that the present invention is not limited to a one-sided array architecture as shown in FIG. 5. A defect detector 54 may be connected to the isolated slice at each end of word line 16. The defect detector 54 shown in FIG. 5 may comprise a double inverter, but again it is emphasized that the invention is not limited to the illustrated circuit.

Figure 6:
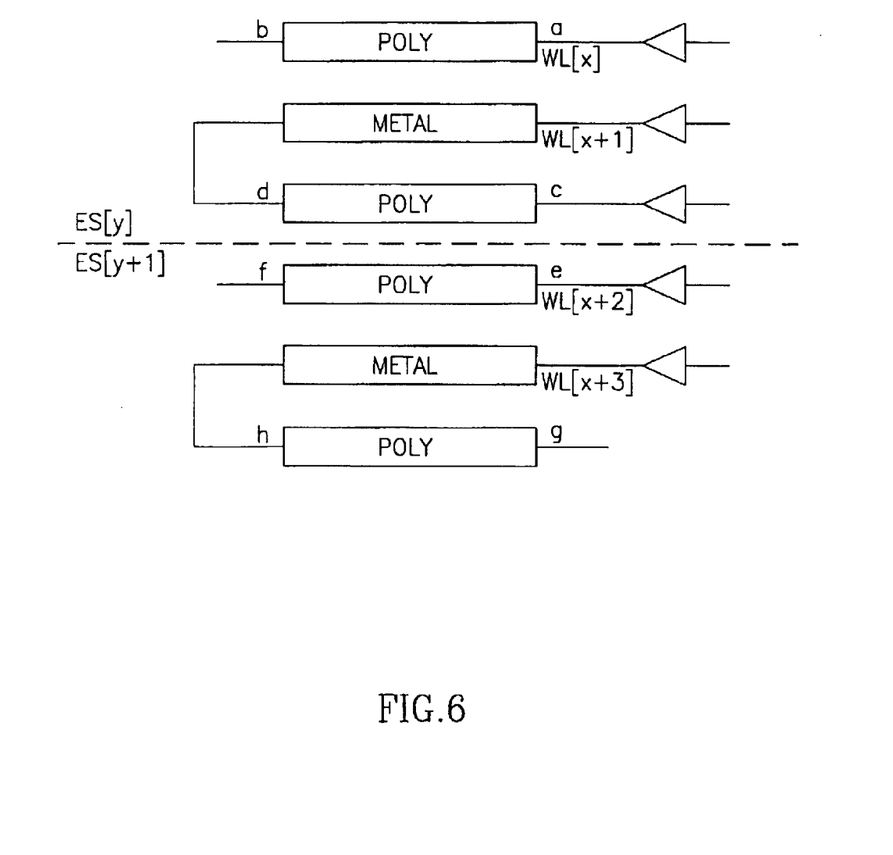
FIG. 6 is a simplified schematic illustration of a structure of word line comprising polysilicon and metal layers.

In order to detect a defect (short or open circuit) in word lines 16 in a given isolated slice, one of the word lines 16, is preferably turned on, that is, raised to a predefined voltage. A portion of the global bit lines, for example, the odd global bit lines, may be driven to a voltage Vdd through BS transistors 51, while the even global bit lines are driven to a close-to-ground level by the discharge transistor 52 that is turned on. Afterwards, the discharge transistor 52 may be turned off, and depending on the signal at the input of the defect detectors 54, the processor 56 (not shown in FIG. 5) may determine if there is a defect, and perhaps the nature of the defect, as is now described more in details. A possible structure of the word lines 16 is illustrated in FIG. 6. Word lines 16 may comprise a polysilicon layer. Part of the word lines, for example even word lines, such as the one designated WL[x], wherein x is an even integer, may be driven directly from the X-decoder 62. Other word lines, e.g. the odd ones, such as the one designated WL[x+1], may be driven through a metal strip that is connected to the polysilicon word line at its far end (i.e., far from the word line driver). Accordingly, a first word line layer WL[x] (even) may have ends a and b. A second word line layer WL[x+1] (odd) may have ends c and d, which are driven through a metal strip 63. Word lines WL[x] and WL[x+1] may comprise part of an erase sector ES[y]. Similarly, a third word line layer WL[x+2] (even) may have ends e and f. A fourth word line layer WL[x+3] (odd) may have ends g and h, which are driven through a metal strip 65. Word lines WL[x+2] and WL[x+3] may comprise part of an erase sector ES[y+1].

Figure 7:
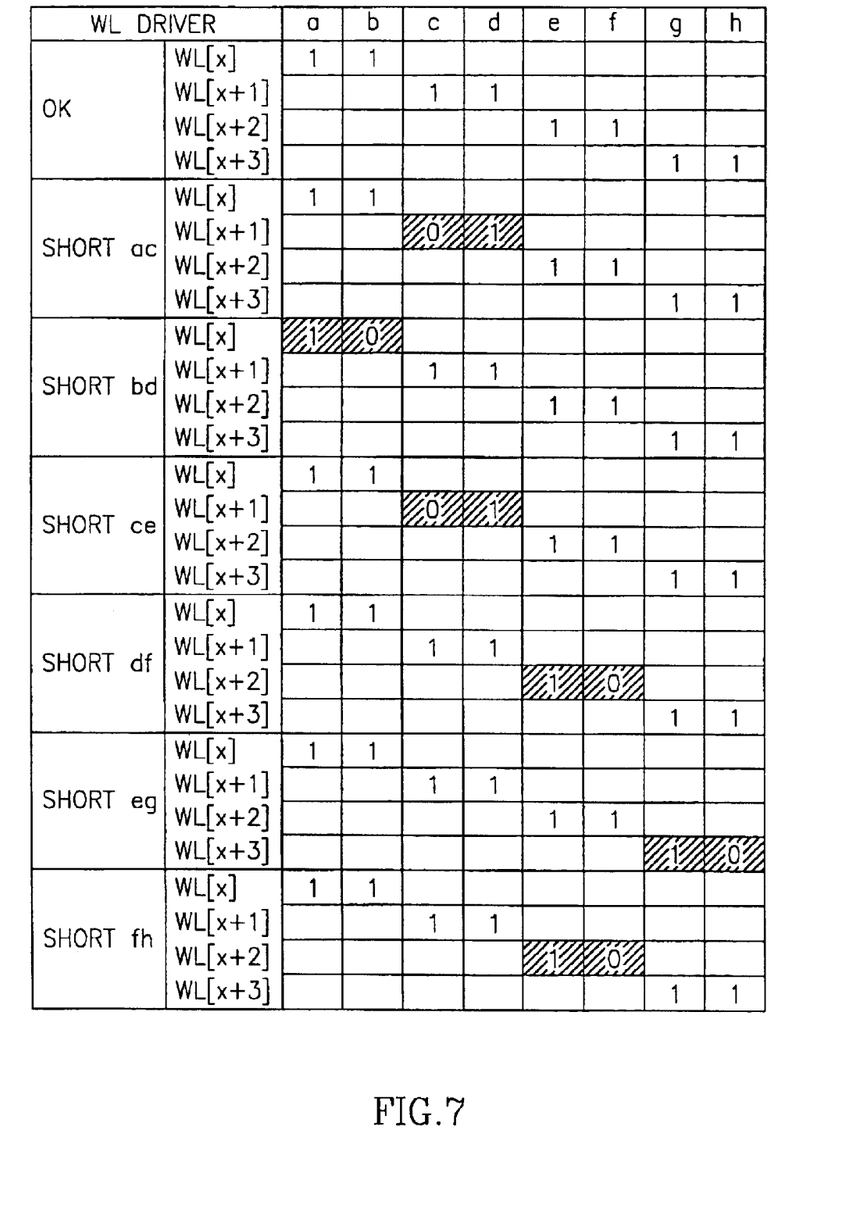
FIG. 7 is a simplified truth table for interpreting the output signals of the defect detectors of FIG. 5, in the case of defects due to short circuits in word lines, in accordance with an embodiment of the present invention.

Reference is now made to FIG. 7, which illustrates a truth table for interpreting the output signals of the defect detectors 54 of FIG. 5, in the case of defects due to short circuits. As an example, the defect detector will output a '1' if the voltage level at its input is above a predetermined threshold, and it will output a '0' if its input is below that threshold. If there are no defects in any of the polysilicon lines and metal lines, then the logic circuitry of defect detector 54 may output the binary bit '1'. Accordingly, for no defects, for each pair of the edge defect detectors when driving the word lines WL[x], WL[x+1], WL[x+2] and WL[x+3], the binary output is 11 in all cases.

If there is a short circuit between end a of word line WL[x] and end c of word line WL[x+1], then when WL[x] is accessed, this short may remain unnoticed due to the large resistance of the polysilicon WL[x+1], and both defect detectors will output a '1'. However, in that same case of a short circuit between end a of word line WL[x] and end c of word line WL[x+1], when accessing WL[x+1], although end d of word line WL[x+1] may be driven to a positive voltage, end c may show little or no voltage, since end c is shorted to the grounded end a and there is a relatively large resistance in the polysilicon line between c and d. Accordingly, if there is a short between a and c, the binary output for word line WL[x+1] is 01, and for the other word lines is 11.

If there is a short circuit between end b of word line WL[x] and end d of word line WL[x+1], then end a of word line WL[x] may be driven to a positive voltage, whereas end b may show little or no voltage. Accordingly, if there is a short between b and d, the binary output for word line WL[x] is 10, and for the other word lines is 11.

If there is a short circuit between end c of word line WL[x+1] and end e of word line WL[x+2], then although end d of word line WL[x+1] may be driven to a positive voltage, end c may show little or no voltage, because end c is shorted to the grounded end e and there is a relatively large resistance in the polysilicon line between c and d. End e may still be driven to a positive voltage. Accordingly, if there is a short between c and e, the binary output for word line WL[x+1] is 01, and for the other word lines is 11. It is noted that in this embodiment of the invention, no distinction is made between an a/c short and a c/e short.

If there is a short circuit between end d of word line WL[x+1] and end f of word line WL[x+2], then end e of word line WL[x+2] may be driven to a positive voltage, whereas end f may show little or no voltage. Accordingly, if there is a short between d and f, the binary output for word line WL[x+2] is 10, and for the other word lines is 11.

If there is a short circuit between end e of word line WL[x+2] and end g of word line WL[x+3], then although end g of word line WL[x+3] may be driven to a positive voltage, end h may show little or no voltage, due in part to the resistance of the polysilicon line between g and h. End e may still be driven to a positive voltage. Accordingly, if there is a short between e and g, the binary output for word line WL[x+3] is 10, and for the other word lines is 11.

If there is a short circuit between end f of word line WL[x+2] and end h of word line WL[x+3], then end e of word line WL[x+2] may be driven to a positive voltage, whereas end f may show little or no voltage. End h may still be driven to a positive voltage. Accordingly, if there is a short between f and h, the binary output for word line WL[x+2] is 10, and for the other word lines is 11. It is noted that in this embodiment of the invention, no distinction is made between a d/f short and an f/h short.

Figure 8:
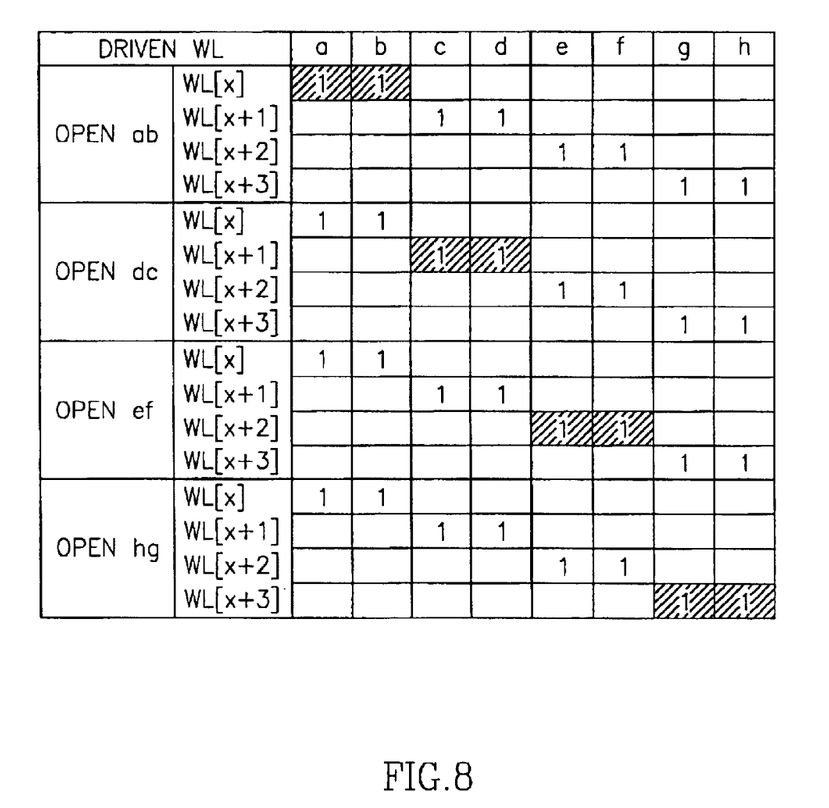
FIG. 8 is a simplified truth table for interpreting the output signals of the defect detectors of FIG. 5, in the case of defects due to open circuits in word lines, in accordance with an embodiment of the present invention.

Reference is now made to FIG. 8, which illustrates a truth table for interpreting the output signals of the defect detectors 54 of FIG. 5, in the case of defects due to open circuits. Again, if there are no defects in any of the polysilicon lines and metal lines, then the logic circuitry of defect detector 54 may output the binary bit '1'. Accordingly, for no defects, for each pair of the ends of the word lines WL[x], WL[x+1], WL[x+2] and WL[x+3,]the binary output is 11.

If there is an open circuit between ends a and b of word line WL[x], then end a of word line WL[x] may be driven to a positive voltage, whereas end b may show little or no voltage. Accordingly, if there is an open circuit between a and b, the binary output for word line WL[x] is 10, and for the other word lines is 11.

If there is an open circuit between ends c and d of word line WL[x+1], then end d of word line WL[x+1] may be driven to a positive voltage, due to the metal line, whereas end c may show little or no voltage. Accordingly, if there is an open circuit between c and d, the binary output for word line WL[x+1] is 01, and for the other word lines is 11.

If there is an open circuit between ends e and f of word line WL[x+2], then end e of word line WL[x+2] may be driven to a positive voltage, whereas end f may show little or no voltage. Accordingly, if there is an open circuit between e and f, the binary output for word line WL[x+2] is 10, and for the other word lines is 11.

If there is an open circuit between ends g and h of word line WL[x+3], then end h of word line WL[x+3] may be driven to a positive voltage, due to the metal line, whereas end g may show little or no voltage. Accordingly, if there is an open circuit between g and h, the binary output for word line WL[x+3] is 01, and for the other word lines is 11.

Figure 9A:
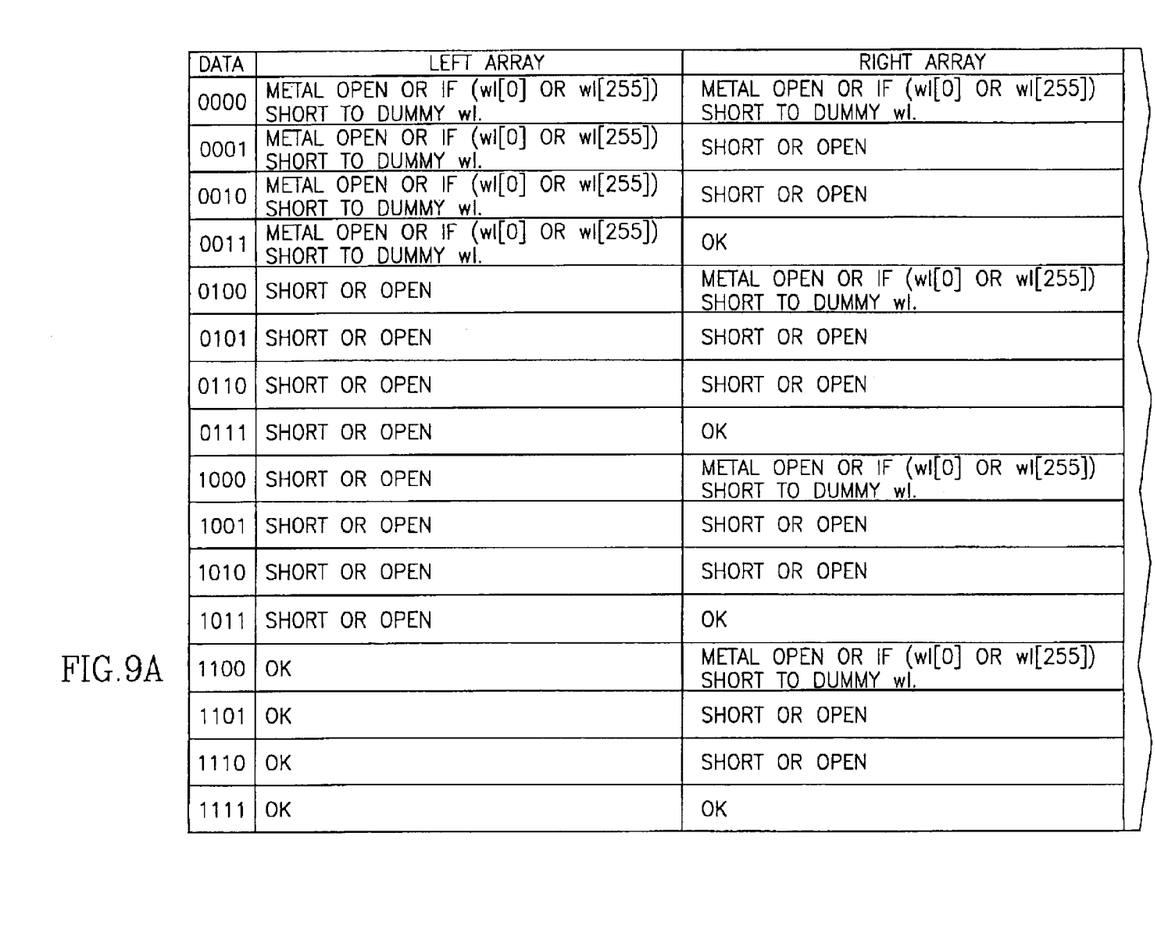
FIGS. 9A–9B comprise a simplified table summarizing the results of the defect detection for word lines in FIG. 5, in accordance with an embodiment of the present invention.
Figure 9B:
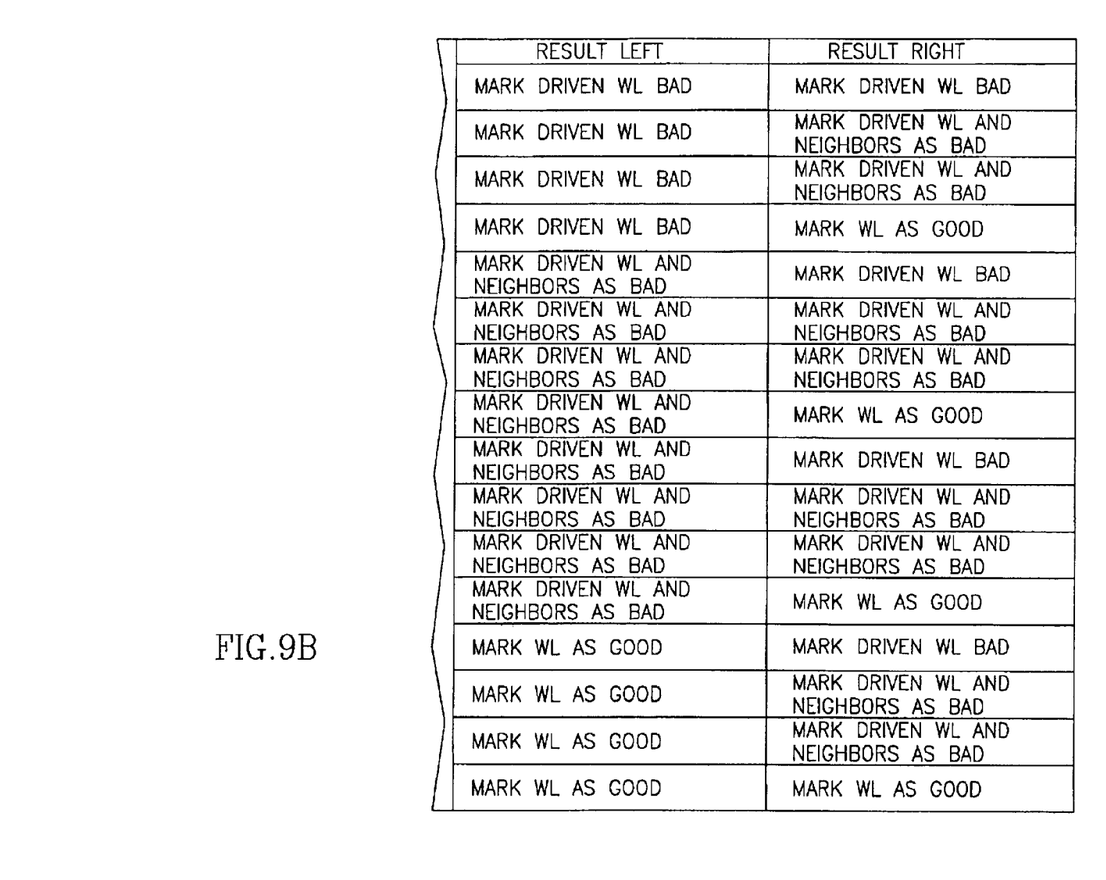

It is noted that the defect signals for some of the open and short circuits may be ambiguous, meaning that in this embodiment of the invention, no distinction may be made between some situations of open and short circuits. However, it is sufficient to mark the detected word line as having a defect. FIGS. 9A–9B summarize the results of the defect detection for both of the sets of word lines in FIG. 5 (i.e., the word lines to the left and right of XDEC 62).

Figure 10:
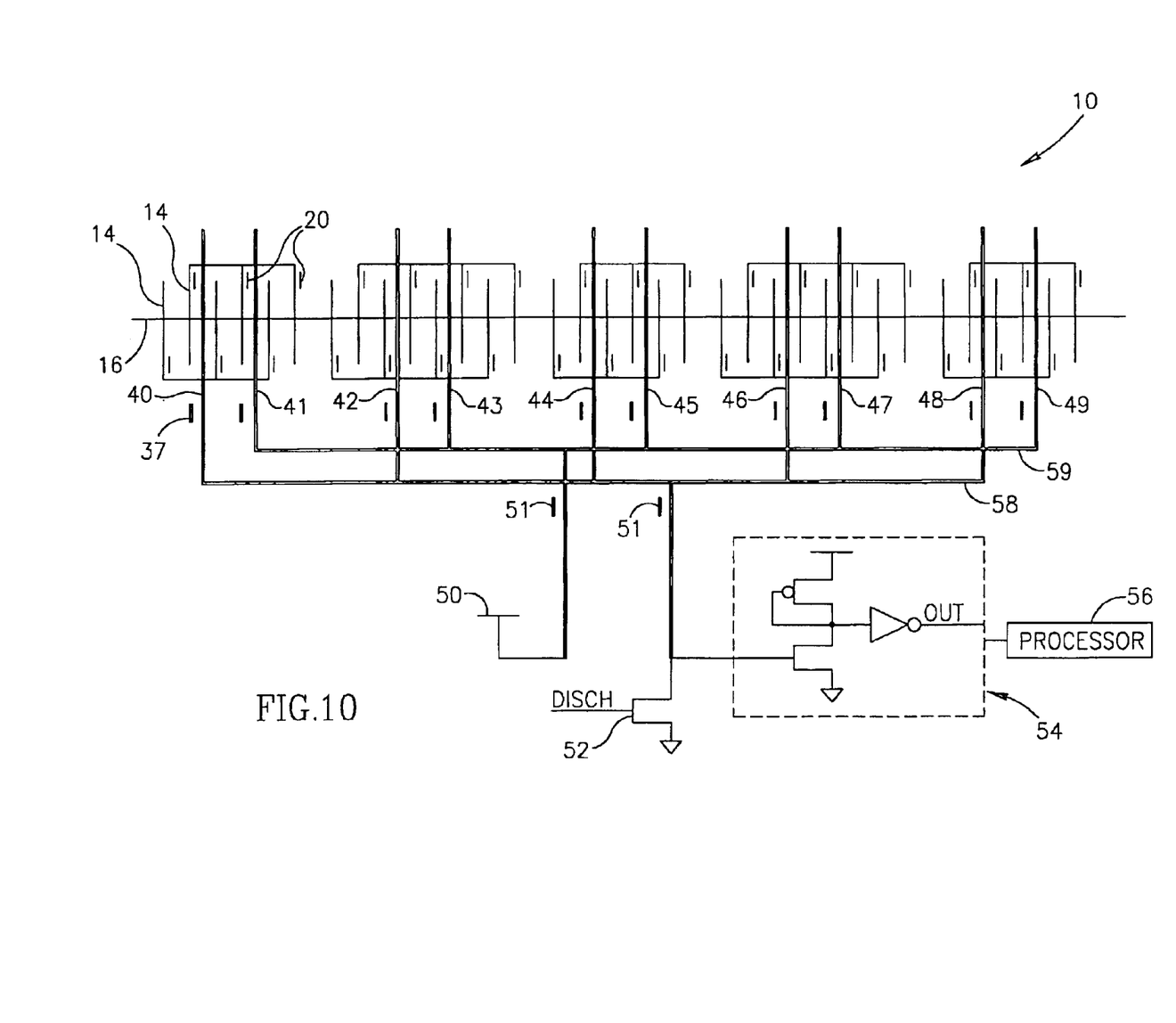
FIG. 10 is a simplified schematic illustration of a method for detecting defects due to a short between word lines and bit lines (either local bit lines or global bit lines), in accordance with an embodiment of the present invention.

Reference is now made to FIG. 10, which illustrates a method for detecting defects due to a short between word lines 16 and bit lines (i.e., either local bit lines 14 or global bit lines 18). For the sake of simplicity and clarity, memory cells 12 are not shown in FIG. 10.

In order to detect a short between word lines 16 and bit lines in a given isolated slice, all select transistors 20 and the CS transistors 37 are preferably turned on. The word lines 16 may be driven to a predefined high voltage one at a time. None of the bit lines may be driven to a non-zero voltage Vdd. If there is no short between the particular word line that has been driven to a high voltage and the bit lines, there should be little or no output signal at the defect detector 54, because no voltage should reach the bit lines. If, however, there is a significant output signal at the defect detector 54, it is interpreted by the processor 56 as a short between the word line and one of the bit lines.

It will be appreciated by persons skilled in the art that the present invention is not limited by what has been particularly shown and described herein above. Rather the scope of the invention is defined by the claims that follow:

What is claimed is:

1. Apparatus for defect detection, comprising:
   a memory cell array comprising memory cells connected to word lines and local bit lines;
   global bit lines connected to said local bit lines, said global bit lines comprising at least two portions, one portion connected to a voltage source, and the other portion connected to a defect detector, said defect detector comprising logic circuit components for outputting a logic signal.

2. Apparatus according to claim 1, wherein each of said portions of said global bit lines are drivable simultaneously.

3. Apparatus according to claim 1, wherein each of said portions of said global bit lines are drivable separately.

4. Apparatus according to claim 1, wherein each of said portions of said local bit lines are drivable simultaneously.

5. Apparatus according to claim 1, wherein each of said portions of said local bit lines are drivable separately.

6. Apparatus according to claim 1, wherein one of said portions of said global bit lines comprises even global bit lines and the other portion of said global bit lines comprises odd global bit lines.

7. Apparatus according to claim 1, wherein one of said portions of said local bit lines comprises even local bit lines and the other portion of said local bit lines comprises odd local bit lines.

8. Apparatus according to claim 1, wherein said portions of local or global bit lines are arranged such that in any pair of adjacent local bit lines one corresponds to the even portion and the other to the odd portion, and in any pair of adjacent global bit lines one corresponds to the even portion and the other to the odd portion.

9. Apparatus according to claim 1, wherein said portion of said global bit lines that is connected to said defect detector is also connected to a discharge transistor.

10. Apparatus according to claim 1, further comprising a processor adapted to process logic signals from said defect detector.

11. Apparatus according to claim 1, wherein said connections are electrical connections through at least one conducting transistor.

* * * * *

UNITED STATES PATENT AND TRADEMARK OFFICE
CERTIFICATE OF CORRECTION

PATENT NO. : 6,781,897 B2
DATED : August 24, 2004
INVENTOR(S) : Dvir, Ran et al.

It is certified that error appears in the above-identified patent and that said Letters Patent is hereby corrected as shown below:

Title page,
Item [73], Assignee, should read:
-- Saifun Semiconductors, Ltd.
  Netanya (IL)
  Infineon Technologies Flash Ltd.
  Netanya (IL) --.

Signed and Sealed this

Fourteenth Day of February, 2006

JON W. DUDAS
*Director of the United States Patent and Trademark Office*